US008243493B2

(12) United States Patent
Toda

(10) Patent No.: US 8,243,493 B2
(45) Date of Patent: Aug. 14, 2012

(54) RESISTANCE CHANGE MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1076 days.

(21) Appl. No.: 12/128,343

(22) Filed: May 28, 2008

(65) Prior Publication Data
US 2009/0003047 A1    Jan. 1, 2009

(30) Foreign Application Priority Data
Jun. 29, 2007 (JP) ................................. 2007-171488

(51) Int. Cl.
*G11C 11/00* (2006.01)
(52) U.S. Cl. .................... 365/148; 365/163; 365/158
(58) Field of Classification Search .............. 365/46, 365/94, 100, 113, 129, 148, 163, 48, 55, 365/62, 66, 74, 78, 80–93, 130, 131, 158, 365/171–173, 209, 213, 225.5, 230.07, 232, 365/243.5; 257/2–5, 9, 296, 310, E21.35, 257/E31.047, E27.006; 438/29, 95, 96, 166, 438/135, 240, 785, 259, 365, 482, 486, 597; 977/754
See application file for complete search history.

(56) References Cited

U.S. PATENT DOCUMENTS

| | | | | |
|---|---|---|---|---|
| 6,795,334 B2* | 9/2004 | Iwata et al. | ................... | 365/158 |
| 6,879,508 B2 | 4/2005 | Tran | | |
| 7,184,301 B2* | 2/2007 | Sugibayashi et al. | ......... | 365/158 |
| 2003/0117834 A1* | 6/2003 | Iwata et al. | ................... | 365/158 |
| 2004/0100835 A1* | 5/2004 | Sugibayashi et al. | ......... | 365/200 |
| 2006/0197115 A1 | 9/2006 | Toda | | |
| 2006/0203541 A1* | 9/2006 | Toda | ............................. | 365/163 |
| 2006/0268594 A1* | 11/2006 | Toda | ............................. | 365/100 |

FOREIGN PATENT DOCUMENTS

| | | |
|---|---|---|
| JP | 2003-257177 | 9/2003 |
| JP | 2006-514393 | 4/2006 |
| JP | 2006-155846 | 6/2006 |

OTHER PUBLICATIONS

U.S. Appl. No. 10/507,475, filed Apr. 24, 2006, Haruki Toda.

* cited by examiner

*Primary Examiner* — Alexander Sofocleous
*Assistant Examiner* — Harry W Byrne
(74) *Attorney, Agent, or Firm* — Oblon, Spivak, McClelland, Maier & Neustadt, L.L.P.

(57) ABSTRACT

A resistance change memory device includes: a semiconductor substrate; a cell array so formed on the substrate as to have resistance-change memory cells three-dimensionally stacked and arranged; and a sense amplifier array formed on the substrate under the cell array, wherein the cell array includes first and second cell array blocks arranged in a bit line direction, and first and second bit lines are selected from the first and second cell array blocks, respectively, to constitute a pair and coupled to differential input nodes in the sense amplifier array.

16 Claims, 11 Drawing Sheets

RESISTANCE CHANGE MEMORY DEVICE

CROSS-REFERENCE TO RELATED APPLICATION

This application is based on and claims the benefit of priority from the prior Japanese Patent Application No. 2007-171488, filed on Jun. 29, 2007, the entire contents of which are incorporated herein by reference.

BACKGROUND OF THE INVENTION

1. Field of the Invention

This invention relates to a resistance change memory device with a three-dimensional cell array structure.

2. Description of the Related Art

A resistance change memory device has been proposed to store a resistance value as data, which is reversibly exchanged by applying voltage, current or heat, and it is noticed for succeeding to the conventional flash memory. This resistance change memory is suitable for miniaturizing the cell size, and for constituting a cross-point cell array. In addition, it is easy to stack cell arrays.

There have already been proposed by us some three dimensional (3-D) cell array structures of this kind of memory devices. For example, refer to JP 2005-522045A (PCT/JP2003/000155), and JP 2006-514393A (PCT/JP2003/003257). As explained in the latter patent application, the peripheral circuit including sense amplifiers is formed on the semiconductor substrate, on which the cell arrays are stacked.

SUMMARY OF THE INVENTION

According to an aspect of the present invention, there is provided a resistance change memory device including:
a semiconductor substrate;
a cell array so formed on the substrate as to have resistance-change memory cells three-dimensionally stacked and arranged; and
a sense amplifier array formed on the substrate under the cell array, wherein
the cell array includes first and second cell array blocks arranged in a bit line direction, and first and second bit lines are selected from the first and second cell array blocks, respectively, to constitute a pair and coupled to differential input nodes in the sense amplifier array.

According to another aspect of the present invention, there is provided a resistance change memory device including:
a semiconductor substrate;
at least three, first, second and third, cell array blocks formed on the substrate and arranged in the bit line direction, the cell array blocks including resistance-change memory cells three-dimensionally stacked and arranged;
two systems of sense amplifier arrays formed on the substrate under each cell array block; and
vertical wirings disposed on both sides of each cell array block in the bit line direction, to which adjacent bit lines in each layer in the cell array block are alternatively coupled, wherein
each layer of the cell array blocks includes:
bit lines and word lines disposed to cross each other;
memory cells disposed at the cross points of the bit lines and word lines;
reference cells formed of multiple memory cells disposed at both end portions of adjacent two bit lines to be connected in parallel, the reference cells being coupled to the adjacent two bit lines one by one; and
reference word lines disposed in parallel with the word lines to drive the reference cells.

DETAILED DESCRIPTION OF THE EMBODIMENTS

Figure 1:
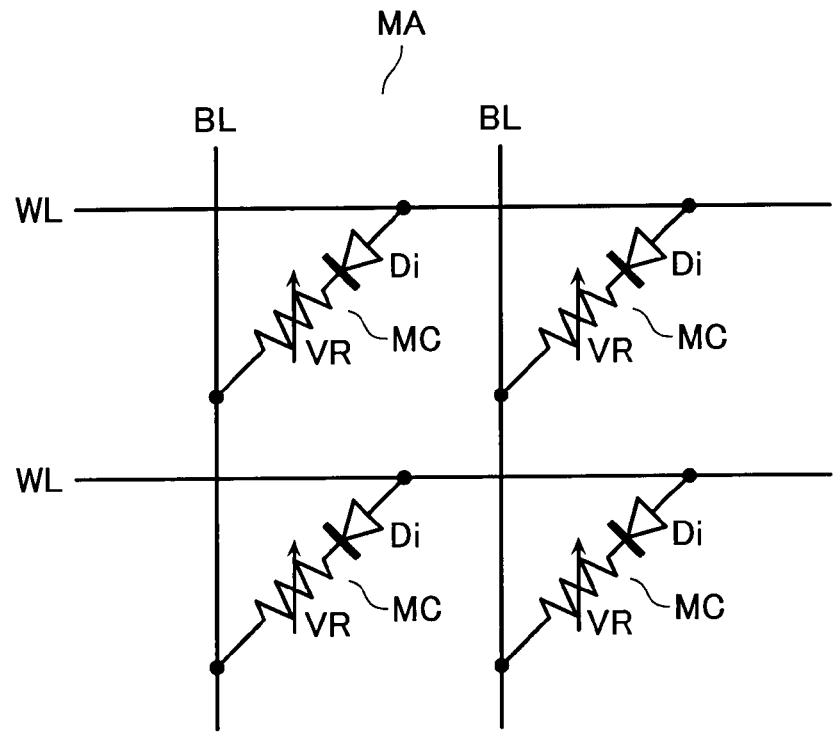
FIG. 1 shows a basic cell array configuration of a resistance change memory in accordance with an embodiment.

Prior to the explanation of embodiments, the outline of the present invention will be explained below. In case memory cells are miniaturized and three-dimensionally stacked, to realize the cell array properties, it is in need of thinking to achieve high-speed data read and write. Explaining in detail, in place of the conventional sense scheme used in the normal NAND-type flash memory, which detects a bit line discharge state determined in accordance with a selected cell state, a reference cell scheme usually used in the NOR-type flash memory will be effective, which detects a cell current in comparison with a reference cell current. Further in this case, it will be useful to arrange the sense amplifiers for every bit line, and arrange the reference cells for every bit line like in the conventional DRAM.

In order to adapt the above-described sense system to a resistance change memory with a three dimensional (3-D) and a cross-point type cell array, it will be required to think some technical points as follows:

First, an open bit line scheme should be adapted between cell array blocks laterally arranged adjacent to each other. For example, in case of sensing cell data in the central cell block within laterally arranged three cell blocks, a reference cell will be selected from ones disposed on the opposite sides of the central cell block.

Second, in case the above-described open bit line scheme is adapted, four sense amplifier systems under the three cell array blocks (i.e., two sense amplifier systems disposed on both edges under the central cell array block, and other two sense amplifier systems disposed on the edges adjacent to the central cell block under the cell blocks on the opposite sides of the central cell array block) are alternatively used in accordance with the cell array layer including a selected cell in the central cell array block.

Third, in case a memory cell stores data defined by a high resistance state as a stable state and at least one of low resistance states, a plurality of high resistance state cells are connected in parallel to constitute a reference cell with a medium resistance state (i.e., reference resistance value) set between the high resistance state and the low resistance state. Therefore, changing the number of cells accessed in parallel, it is able to adjust the reference resistance value of the reference cell.

Fourth, in the 3-D cell array block, adjacent two cell arrays are so stacked as to share word lines and bit lines. Odd numbered bit lines, which are counted from the bottom of the cell block, as the first bit line layer being defined as 0(zero)-order, are coupled in common, and even numbered bit lines also are coupled in common. These bit lines are coupled to bit line multiplexer circuits under a cell array block, and then cross-coupled three-dimensionally to sense amplifiers under the adjacent cell array blocks with multiple metal wirings formed in the multiplexer circuits.

Fifth, in the bit line multiplexer circuit (i.e., bit line select circuit) disposed under the cell array blocks, one of multiple bit lines is selected to be coupled to a sense amplifier used in common to the multiple bit lines.

Embodiments will be explained with reference to the attached drawings below.

FIG. 1 shows an equivalent circuit of a cell array unit in accordance with an embodiment. As shown in FIG. 1, word lines WL and bit lines BL are arranged so as to cross each other, and memory cells MC of a resistance type are disposed at the respective cross points.

Each memory cell MC has a variable resistance element VR and an access element (e.g., diode) Di, which are connected in series. The variable resistance element VR has, for example, such a structure as electrode/transition metal oxide/electrode, and stores data in a non-volatile manner, which is defined by a resistance value of the transition metal oxide. The resistance value is decided by applying voltage, current or Joule heat.

A high resistance state of the variable resistance element VR is usually used as a stable state. For example in case of a binary data storage scheme, the high resistance state (i.e., reset state) and a low resistance state (i.e., set state) are used as two data levels.

Figure 2:
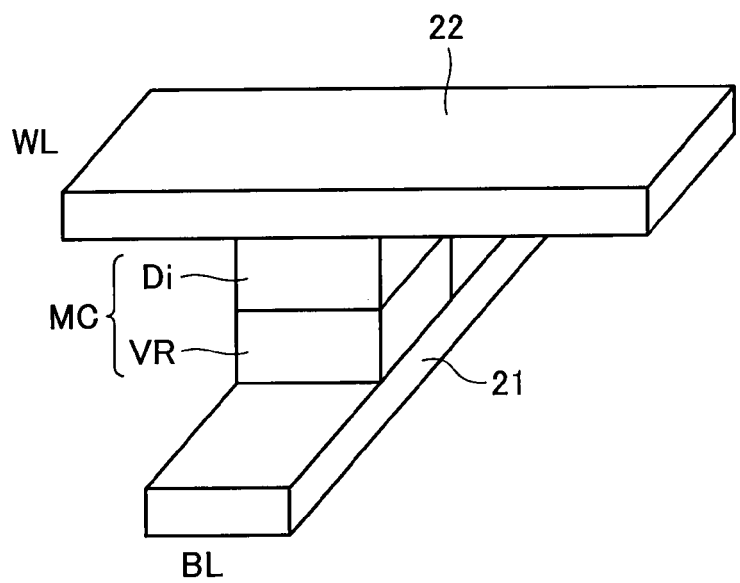
FIG. 2 shows a stack structure of one memory cell portion.

FIG. 2 shows a stacked structure of the memory cell MC. Variable resistance element VR and access element Di are stacked at the cross point of a metal wiring 21 and another metal wiring 22, which are referred to as bit line BL and word line WL, respectively.

Figure 3:
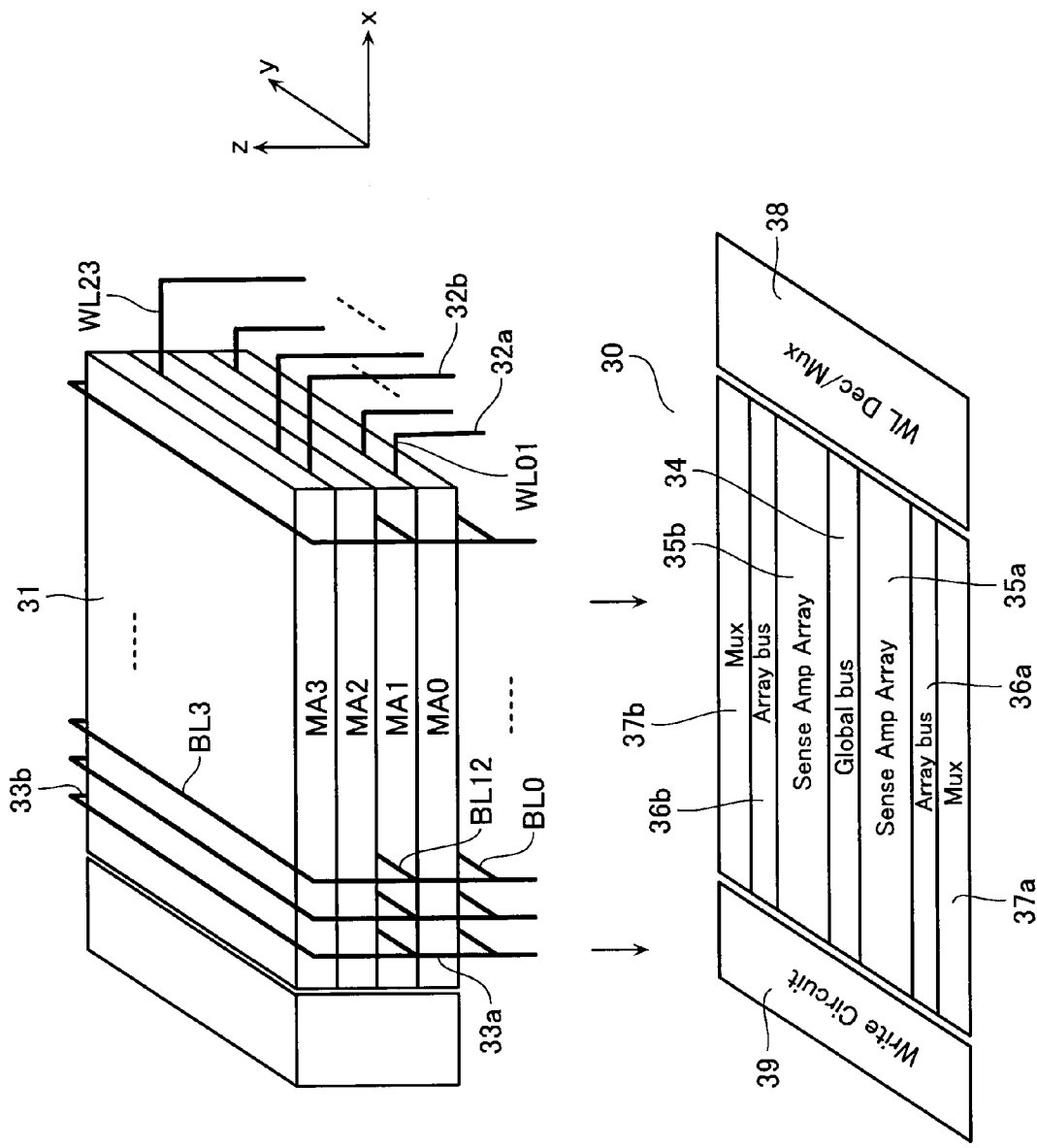
FIG. 3 shows a 3-D cell array block and a circuit on the substrate.

FIG. 3 shows a schematic state where the above-described cell arrays MA are three-dimensionally stacked. Here is shown a three dimensional (3-D) cell array block 31, in which four cell arrays MA0-MA3 are stacked. BL0 is a bit line in the cell array MA0; BL12 is a bit line, which cell arrays MA1 and MA2 share; and BL3 is a bit line in the cell array MA3. If cell arrays are further stacked above or under the cell array block 31, bit lines BL0 and BL3 will also be formed as shared bit lines.

WL01 is a word line, which cell arrays MA0 and MA1 share; and WL23 is another word line, which cell arrays MA2 and MA3 share. That is, bit lines BL and word lines WL run in y-direction and x-direction, respectively, to cross each other.

A read/write circuit of this 3-D cell array block 31 is formed on the semiconductor substrate 30, above which the 3-D cell array 31 is formed. To constitute such the cell array block 31 that cells are selected at the respective cross points of the word lines and bit lines, it is required of it to have vertical wiring lines (via wiring lines) disposed on three sides of the cell array block.

Arranged on one end side of the word lines are vertical wirings 32a and 32b, which are arranged for bringing the word lines WL01 and WL23 into contact with the substrate 30, respectively. Similarly, vertical wirings 33a and 33b are arranged along both end sides of the bit lines for contacting the bit lines BL0, BL12 and BL3 with the substrate 30.

Due to these vertical wirings, signal receiving/transmitting between the circuit on the substrate 30 and the external will be limited. Therefore, accessing and sensing circuits are arranged as shown in FIG. 3.

That is, global bus 34 is disposed at the center of the shady portion of the cell array block 31 in parallel with the word lines for receiving/transmitting data. Sense amplifier arrays 35a and 35b are disposed on opposite sides of the global bus 34. To transfer sensed data to the sense amplifier arrays 35a and 35b, array buses 37a and 37b are disposed on the sides of the sense amplifier arrays 35a and 35b, respectively, to be opposed to the global bus 34.

Multiplexer circuits (MUXs) 37a and 37b are disposed outside of the array buses 36a and 36b, respectively, with which bit lines are contacted at the minimum pitch. MUXs 37a and 37b are bit line select circuits for selectively coupling the bit lines to the sense amplifier arrays 35a and 35b via the array buses 36a and 36b.

Disposed at one end of the global bus 34 is a word line decoder circuit (row decoder) 38, which is for selecting word lines of the cross point cell array. Since the vertical wirings 32a and 32b are contacted with the word line decoder circuit 38 at the minimum pitch, it is not permitted to dispose other wirings, e.g., data lines, on this area.

Therefore, to transmit/receive sensed data and write data between the sense amplifiers and the external, write circuit 39 is disposed at the other end of the global bus 34 opposite to the word line decoder 38.

In FIG. 3, there is shown only one cell array block 31, in which multiple cell arrays are stacked in z-direction. In practice, multiple cell array blocks described above are arranged in the bit line direction (y-direction). Further, in the description below, array buses 37a and 37b, and multiplexer circuits 37a and 37b are integrally referred to as "multiplexers (MUXs)" used for selectively coupling the bit lines to the sense amplifiers.

To achieve a high speed data read performance in the above-described 3-D cell array scheme, it is desired to dispose a sense amplifier and a reference cell for every bit line, and to compare the bit line cell data, i.e., cell resistance, with the reference cell resistance at a high rate. Further, it is required of the reference cell to be set at a stable medium resistance value, which is not easily varied due to accessing disturbance, because the reference cell is accessed frequently. Therefore, it is desired to have constitutions suitable for satisfying the above-described two requirements.

Figure 4:
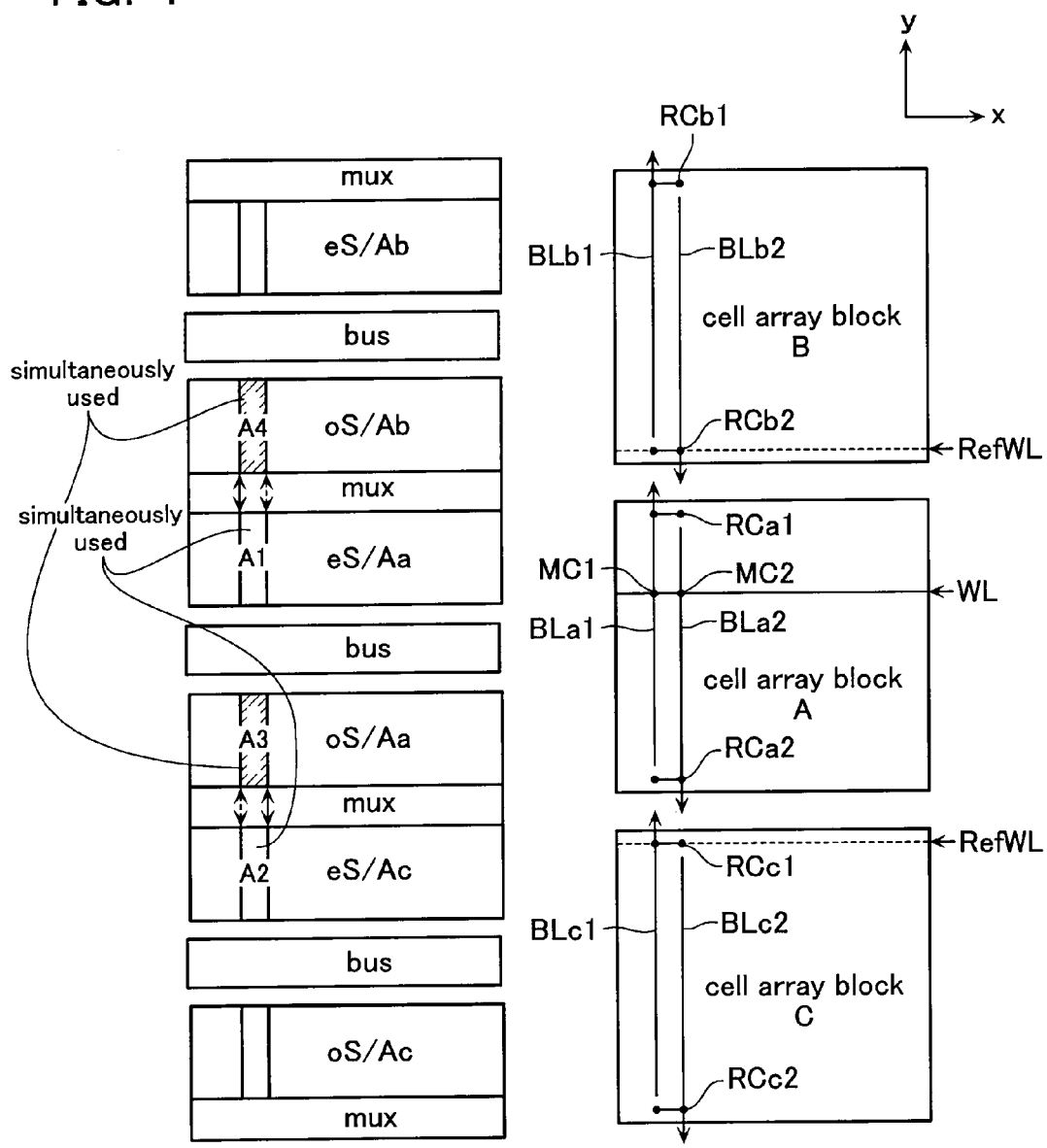
FIG. 4 is a diagram for explaining an open bit line configuration formed between 3-D cell array blocks.

FIG. 4 shows three cell array blocks A, B and C arranged along the y-direction for explaining how reference cells are disposed, and how the open bit line is formed therein.

In the 3-D cross-point type of cell array, all memory cells disposed at the respective cross points of a selected word line and bit lines are simultaneously selected. Therefore, if a reference cell is disposed in the same cell array corresponding to a selected memory cell, and a word line (i.e., reference word line) of the reference cell is selected simultaneously with the selected word line, it becomes such a double selection that a memory cell and a reference cell are selected on a bit line.

To avoid such the situation, a reference cell is to be selected from adjacent two cell arrays disposed on opposite sides of a cell array, in which a memory cell is selected.

The reference cell selection will be explained with reference to FIG. 4 as follows. In FIG. 4, three cell array blocks A, B and C are shown as arranged in y-direction (i.e., in the bit line direction). Assuming that cell arrays are counted in each 3-D cell array block in such a manner that the bottom one is referred to as zero(0) order layer, and the successive layers are referred to as 1st order, 2nd order, and the like in order from the bottom, and the cell arrays are grouped in an even numbered (e-) layer group and an odd numbered (o-) layer group. Sense amplifier arrays in the cell array blocks A, B and C are, as shown in FIG. 4, referred to as even-numbered sense amplifier array eS/A and odd-numbered sense amplifier array oS/A used in common to the e-layer group and o-layer group of the cell arrays, respectively.

The above-described two system sense amplifier arrays eS/A and oS/A corresponds to the sense amplifier arrays 35a and 35b, respectively, shown in FIG. 3.

Supposing that a word line selected in the central cell array block A, two reference word lines RefWL, which are disposed near the cell array block A in the cell array blocks B and C, are selected simultaneously.

Noticing adjacent two memory cells MC1 and MC2 selected by the word line WL in the cell array block A, bit line and sense amplifier selection modes will be explained in detail. One bit line BLa1 coupled to the memory cell MC1 is coupled to the underlying sense amplifier array via the vertical wiring (via wiring) disposed on one end on the cell array block B side, the other end (i.e., end on the cell array block C side) of which serves as an open end. By contrast, another bit line BLa2 coupled to the memory cell MC2 is coupled to the underlying sense amplifier array via the vertical wiring (via wiring) disposed on one end on the cell array block C side, the other end (i.e., end on the cell array block B side) of which serves as an open end.

According to a sense amplifier assignment, with respect to the above-described two bit lines BLa1 and BLa2, one sense amplifier array eS/Aa under the cell array block A and another sense amplifier array eS/Ac under the cell array block C are simultaneously used. Alternatively, one sense amplifier array oS/Aa under the cell array block A and another sense amplifier array oS/Ab under the cell array block B are simultaneously used.

Explaining in detail more, bit line BLb2 (serving as a reference bit line) coupled to reference cell RCb2 selected by the reference word line RefWL disposed in the cell array block B on the cell array block A side constitutes a pair together with the bit line BLa1 in the cell array block A, and this bit line pair is coupled to a sense amplifier A1 in the sense amplifier array eS/Aa under the cell array block A. Similarly, bit line BLc1 (serving as another reference bit line) coupled to the reference cell RCc1 selected by the reference word line RefWL disposed in the cell array block C on the cell array block A side constitutes a pair together with the bit line BLa2 in the cell array block A, and this bit line pair is coupled to another sense amplifier A2 in the sense amplifier array eS/Ac under the cell array block C.

With this assignment, by use of the corresponding bit line pair between adjacent cell array blocks A and B, or between cell array blocks A and C, the open bit line scheme is achieved.

Which is used in two systems of sense amplifier arrays is defined by whether a selected cell belongs to an even (e-) cell array layer or an odd (o-) cell array layer. That is, the above-described example is in a case where a selected cell belongs to an e-cell array layer. By contrast, in case a memory cell is selected in an o-cell array in the cell array block A, a sense amplifier A3 in the sense amplifier array oS/Aa under the cell array block A and another sense amplifier A4 in the sense amplifier array oS/Ab under the cell array block B are simultaneously used.

Figure 5:
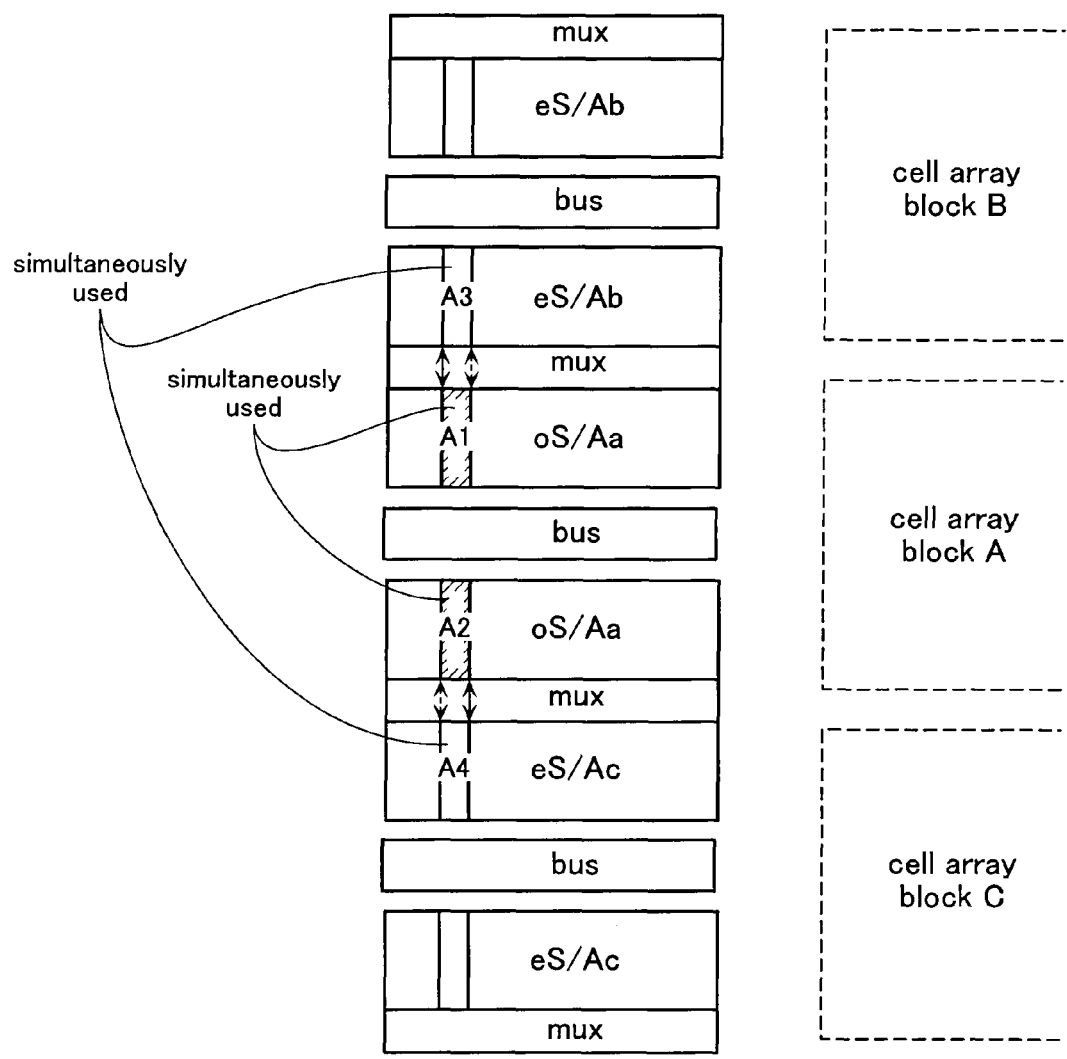
FIG. 5 shows another sense amplifier assignment.

FIG. 5 shows another sense amplifier assignment. In this case, in accordance with which of an e-cell array layer and an o-cell array is selected, two systems of sense amplifier arrays under a selected cell array block are simultaneously used, or two sense amplifier arrays are selected one by one under two cell arrays blocks adjacent to the selected cell array block. Explaining in detail, in case of the o-cell array selection, sense amplifiers A1 and A2 in the two systems of sense amplifier arrays oS/Aa disposed under the selected cell array block A are simultaneously used while in case of the e-cell array selection, sense amplifiers A3 and A4 in the sense amplifier arrays eS/Ab and eS/Ac disposed under the cell array blocks B and C, respectively, near the selected block A, are simultaneously used.

Whichever sense amp assignment is used, to make the sense amplifier serve with an open bit line scheme, it is required to constitute a pair of a bit line and a reference bit line selected from three adjacent cell array blocks, and use alternatively sense amplifiers under these cell array blocks.

So far, it has been explained a case where a word line in the cell array block A is selected. Similarly, in case a word line is selected from another cell array block, two reference word lines are selected from two cell array blocks adjacent to the selected cell array block. Therefore, as shown in FIG. 4, reference cells (RCa1, RCa2), (RCb1, RCb2) and (RCc1, RCc2) are disposed at both ends of the cell array blocks A, B and C, respectively.

Each reference cell is formed of multiple memory cells, which are arranged along the adjacent two bit lines and coupled in parallel. The detail will be explained later.

Figure 6:
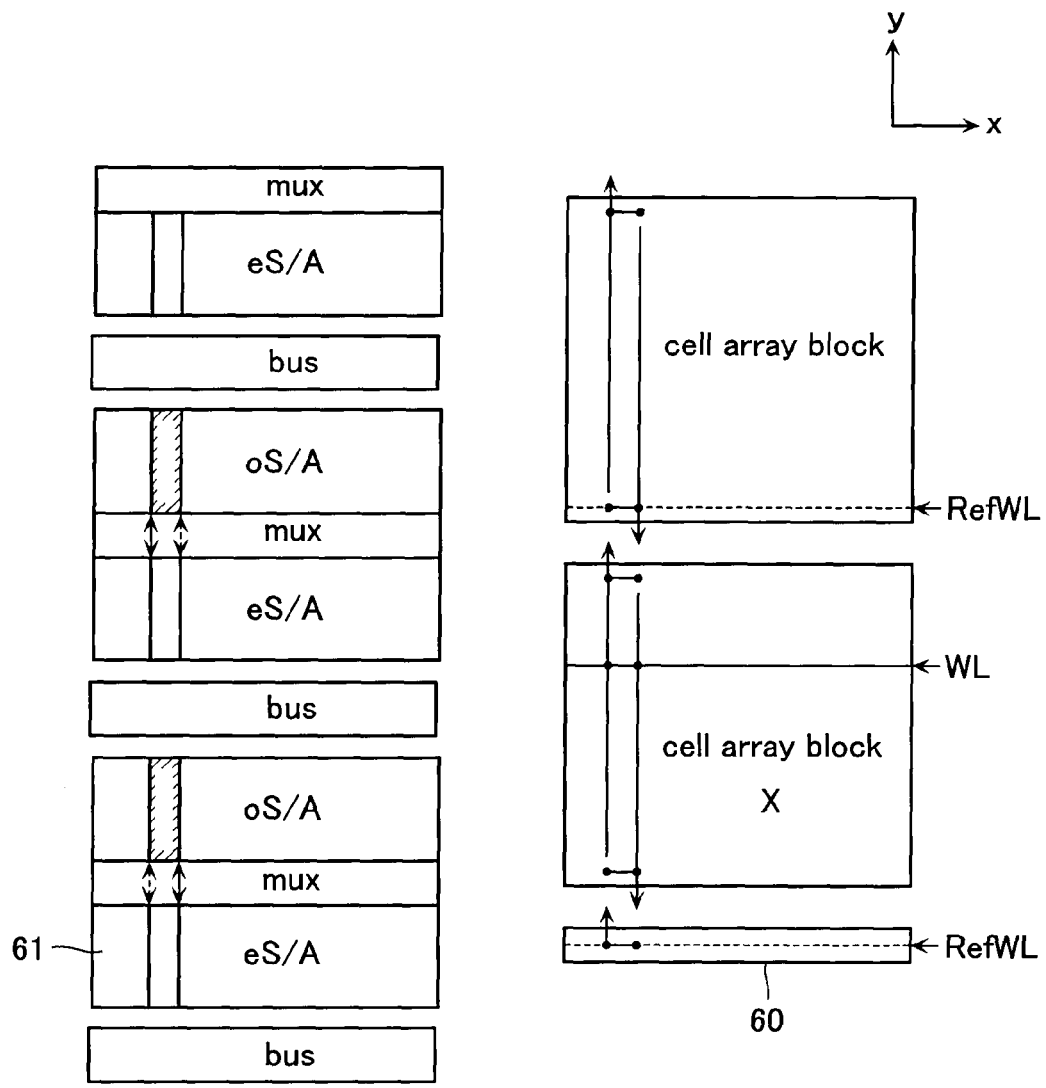
FIG. 6 shows a layout, in which an additional reference cell array block is disposed outside the cell array block arrangement.

If a cell array block is selected at one end of the cell array block arrangement, there is only one adjacent cell array block. Therefore, as shown in FIG. 6, there is prepared additional cell array block 60 used for forming reference cells, and additional sense amplifier array 61 outside of the end cell array block X in the y-direction cell array block arrangement. Further, there is also prepared an additional cell array block and an additional sense amplifier array at the other end portion of the cell array block arrangement (not shown).

Next, a method of constituting the reference cell will be explained in detail.

It is not suitable for stabilizing a reference resistance value to use a normal memory cell structure as a reference cell as it is, and set it to have the reference resistance value as a medium resistance value. The reason is that the above-described reference resistance is not stabilized because its value is disturbed and varied at every access.

In consideration of the above-described situation, in this embodiment, a high resistance state of a memory cell is used for a reference cell. The high resistance state is influenced the least by the cell disturbance because it carries little cell current. Therefore, even if necessary to refresh the cell state for restoring it, it is possible to reduce the number of refresh operations.

To obtain a medium resistance value based on the high resistance state of a memory cell, a reference cell is formed of multiple memory cells coupled in parallel. For example, combining ten memory cells set in the high resistance state, the resistance value becomes one tenth, and it will be used as a reference cell, which serves for providing a basic level for judging a data resistance value.

Figure 7:
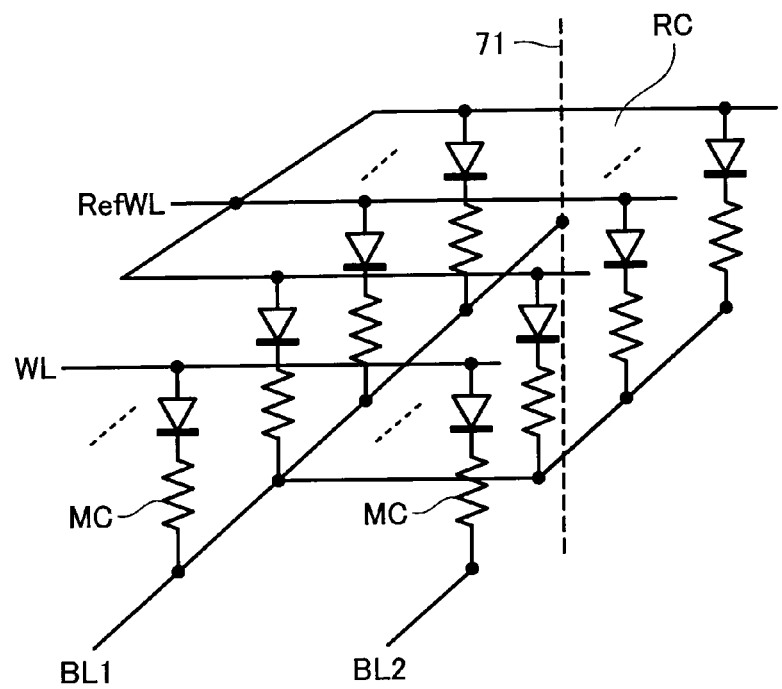
FIG. 7 is a diagram for explaining a method of forming a reference cell.

For example, as shown in FIG. 7, three memory cells MC disposed at each end portion of adjacent two bit lines BL1 and BL2 are coupled in parallel, whereby six memory cells in total constitute a reference cell RC driven by a reference word line RefWL. Only one within the two bit lines BL1 and BL2, which are used for forming a reference cell, i.e., BL1 in this case, is coupled to the underlying circuit via a vertical wiring 71 disposed at this end. The other bit line, BL2, is separated from the reference cell RC at this end, and this end becomes an open end.

At the other end portions of these bit lines BL1 and BL2, another reference cell is formed as similar to the above-description (not shown). At this end, BL2 is coupled to the underlying circuit via another vertical wiring while BL1 is separated from the reference cell, and this end becomes an open end.

According to the above-described method, in which a reference cell is formed of multiple memory cells accessed simultaneously by a reference word line RefWL, it is able to adjust the reference resistance value of the reference cell by adjusting the number of combined memory cells.

In the above described example, multiple memory cells in one cell array are used for constituting a reference cell. By contrast, it is permitted to use multiple memory cells coupled to bit lines in different cell array layers, which are coupled to a vertical (via) wiring line, for constituting a reference cell. In this case, word lines in different cell array layers will be coupled to a common reference word line.

Next, a method of accessing the 3-D cell array will be explained in detail with reference to FIG. 8, which shows seven layers of memory cells C0-C6 in the 3-D cell array and the relationship of word lines WL and bit lines BL coupled to them with a memory cell symbol defined by the combination of variable resistance element VR and diode Di.

Figure 8:
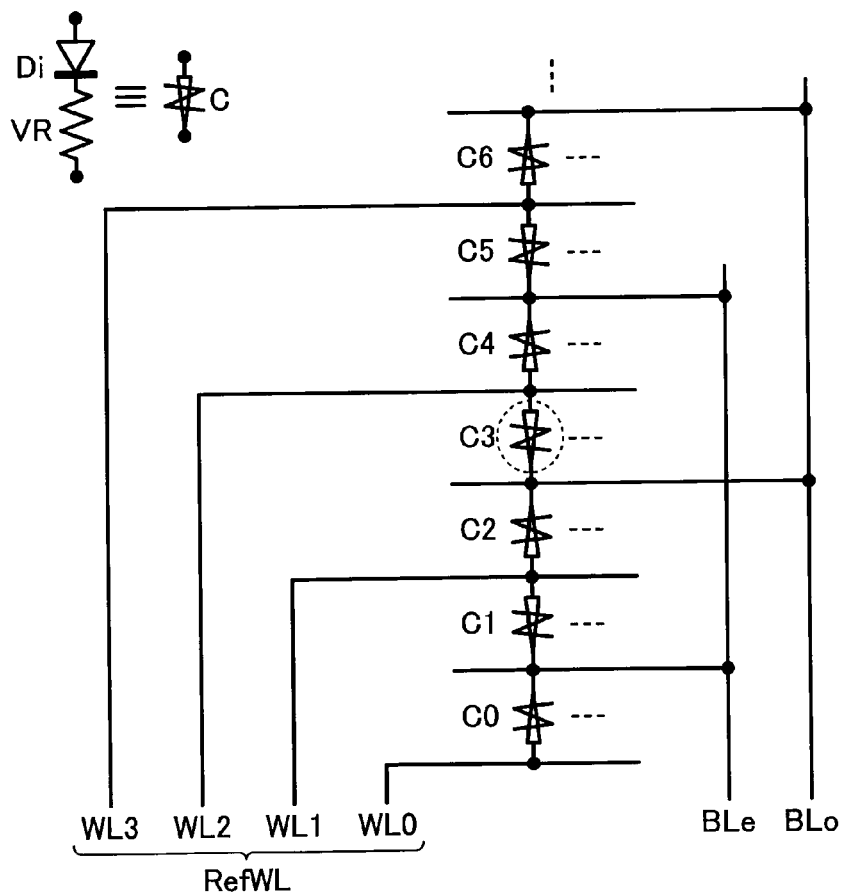
FIG. 8 shows a relationship of sharing bit lines and word lines in the 3-D cell array.

Since two memory cells adjacent to each other in the stacking direction share a word line, four word lines, WL0-WL3, are prepared in the range of seven layers shown in FIG. 8. Further, two memory cells adjacent to each other in the stacking direction share a bit line, and even numbered bit lines BLe are combined to a common bit line BLe while odd numbered bit lines BLo are combined to another common bit line BLo, which are coupled to different sense amplifiers.

Figure 10A:
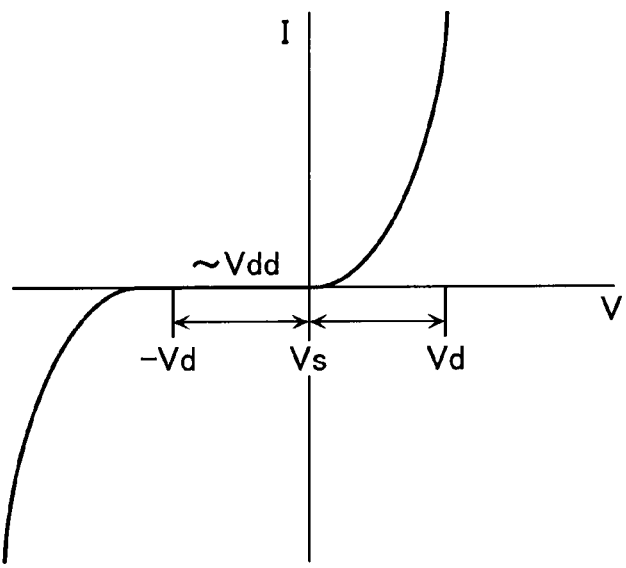
FIGS. 10A and 10B show properties of asymmetric and symmetric access elements, respectively.
Figure 10B:
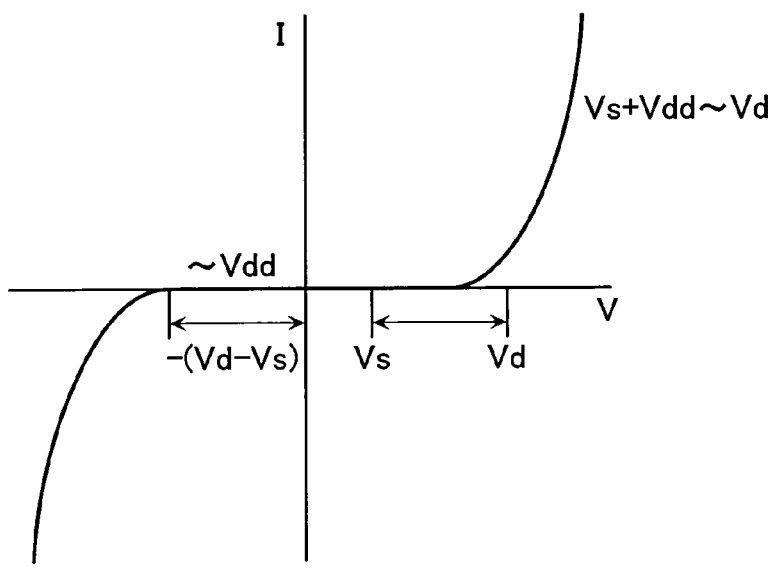

As the access element Di, an asymmetric ohmic device such as a diode (as shown in FIG. 10A), or symmetric ohmic device (as shown in FIG. 10B) may be used. In case the above-described devices is used, in which there is a voltage range of little carrying current, low level voltage Vs and high level voltage Vd applied to a bit line are set as shown in FIGS. 10A and 10B.

In case of a diode shown in FIG. 10A, Vs and Vd are set at ground potential Vss and power supply potential Vdd, respectively, and the diode is forward-biased with Vd=Vdd applied while it does not lead to breakdown with Vdd reverse-biased.

In case of a symmetric ohmic device shown in FIG. 10B, low level voltage Vs is set at Vss+Δ and high level voltage Vd is set at Vs+Vdd, and it carries current with Vd applied while it is not turned on with Vdd reverse-biased.

On the other hand, with respect to the word line, a low level voltage used at a non-select time is set at Vs while a high level voltage used at a select time is set at about Vdd, for example, Vread (≈Vd+2Vs).

Figure 9:
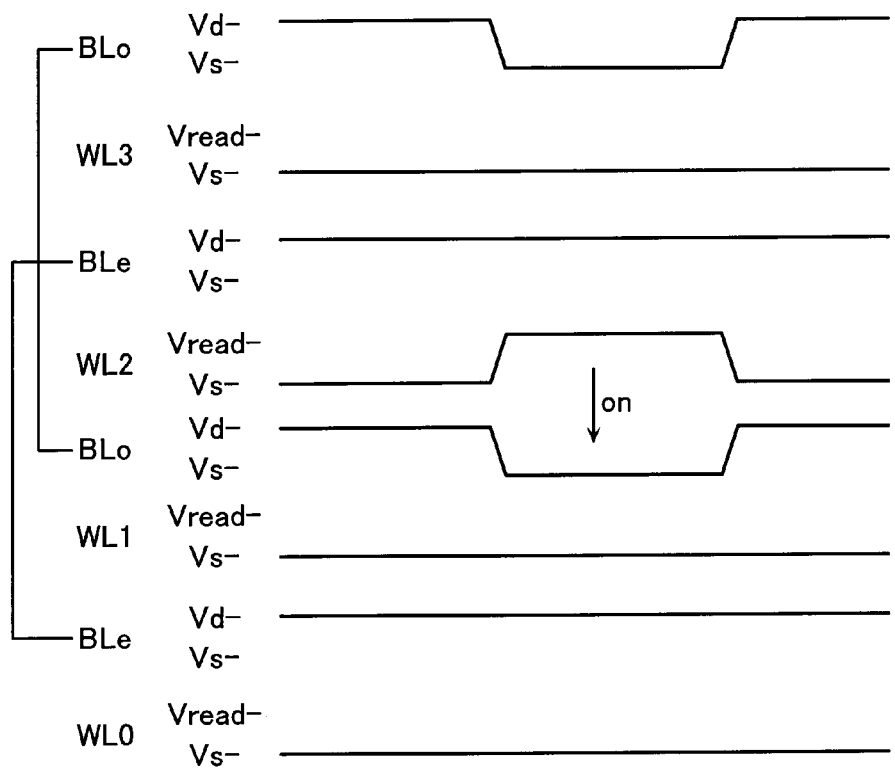
FIG. 9 shows operation waveforms for explaining access method of the 3-D cell array.

In a stand-by mode waiting for cell access, bit lines are set at Vd while word lines are set at Vs, so that all access elements are kept off. As shown in FIG. 9, applying voltage pulse of Vread to a selected word line, WL2, and applying voltage pulse of Vs to a selected bit line, BL0, the access device only in memory cell C3 selected by word line WL2 and bit line BL0 is turned on; and other access devices are kept off.

It should be noted that, as shown in FIG. 8, even-layer bit lines and odd-layer bit lines are coupled in common to BLe and BLo, respectively, and a memory cell in a selected cell array layer is selected.

The access method explained with reference to FIGS. 8 and 9 will be adapted to not only a read operation but also a set or reset operation with the cell array of unipolar type shown in FIG. 1. Explaining briefly, turn on an access element Di in a high resistance state cell, and it is able to apply voltage to a selected variable resistance element VR, and set it to be in a low resistance state (i.e., set operation). On the other hand, turn on an access element in a low resistance state cell, and a selected variable resistance element VR is made to carry a large current to be subjected to Joule heating, and restored to be in a high resistance state (i.e., reset operation).

To group multiple memory cells among different cell array layers into a reference cell, it is useful to access word lines in different layers as a common reference word line RefWL. With this scheme, selected cells coupled to bit lines belonging to a group are turned on to be in a certain medium resistance state serving as a reference cell.

Figure 11:
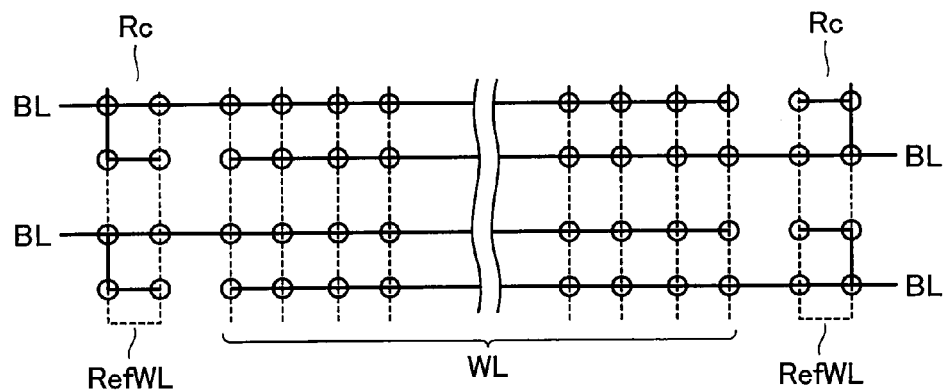
FIG. 11 shows a layout example of one cell array in the 3-D cell array.

FIG. 11 shows a layout of a certain layer in the 3-D cell array block, taking notice of both end portions of the bit lines. At both end portions of the bit lines, multiple memory cells of every two bit lines constitute a reference cell, and reference word lines RefWL are disposed. Explaining in detail, in this case, four memory cells at the end portions of adjacent two bit lines constitute a reference cell RC. One end of one of adjacent two bit lines is coupled to a sense amplifier through a via wiring while the corresponding end of the other bit line becomes an open end. Therefore, wiring lines of bit lines in a certain layer may be arranged at a twice pitch as the bit line pitch, and it is possible to make other bit lines belonging to other groups pass in the spaces between the wiring lines.

Figure 12:
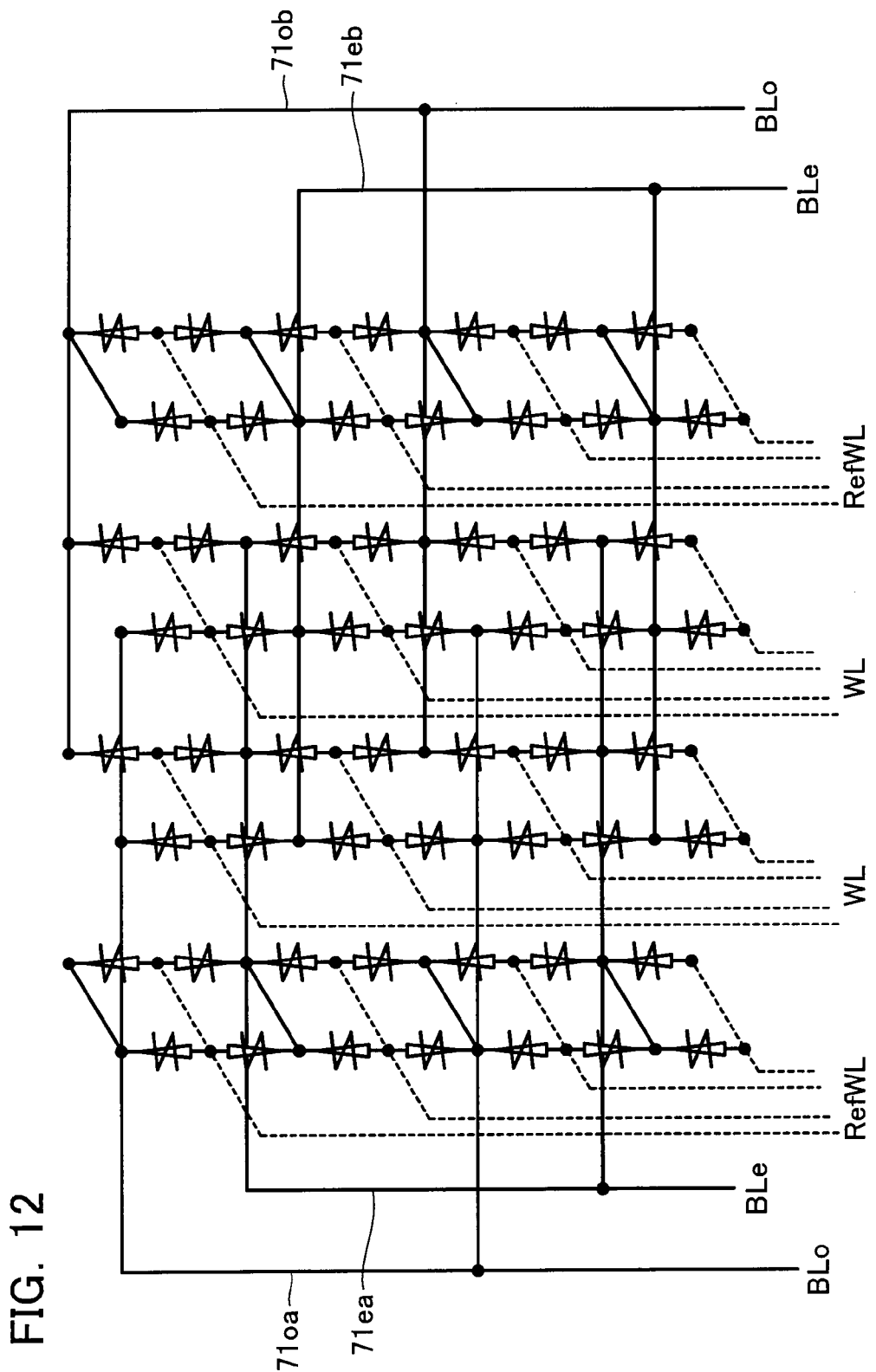
FIG. 12 shows 4×2×7 cell array block structure.

FIG. 12 shows a three dimensional equivalent circuit of the 3-D cell array block with seven layers, with respect to a region of four word lines and two bit lines per layer. In this example, the bottom metal layer serves as word lines, on which an access element layer and a variable resistance element layer are stacked in this order. Why this stack order is used is to make the variable resistance element as far as possible from the substrate and prevent the transistors formed on the substrate from being influenced by the variable resistance element material including many kinds of elements. If there are no fears for this point, it is permitted that the bottom layer serves as the bit lines.

At both ends of the bit lines in the cell array block, bit lines BLe of the even numbered layers and bit lines BLo of the odd numbered layers are alternatively coupled to vertical wirings. Explaining in detail, the even numbered bit lines BLe are alternatively drawn to both ends and coupled in common to via wirings 71ea and 71eb, respectively. Similarly, the odd numbered bit lines BLo are alternatively drawn to both ends and coupled in common to via wirings 71oa and 71ob, respectively.

Figure 13:
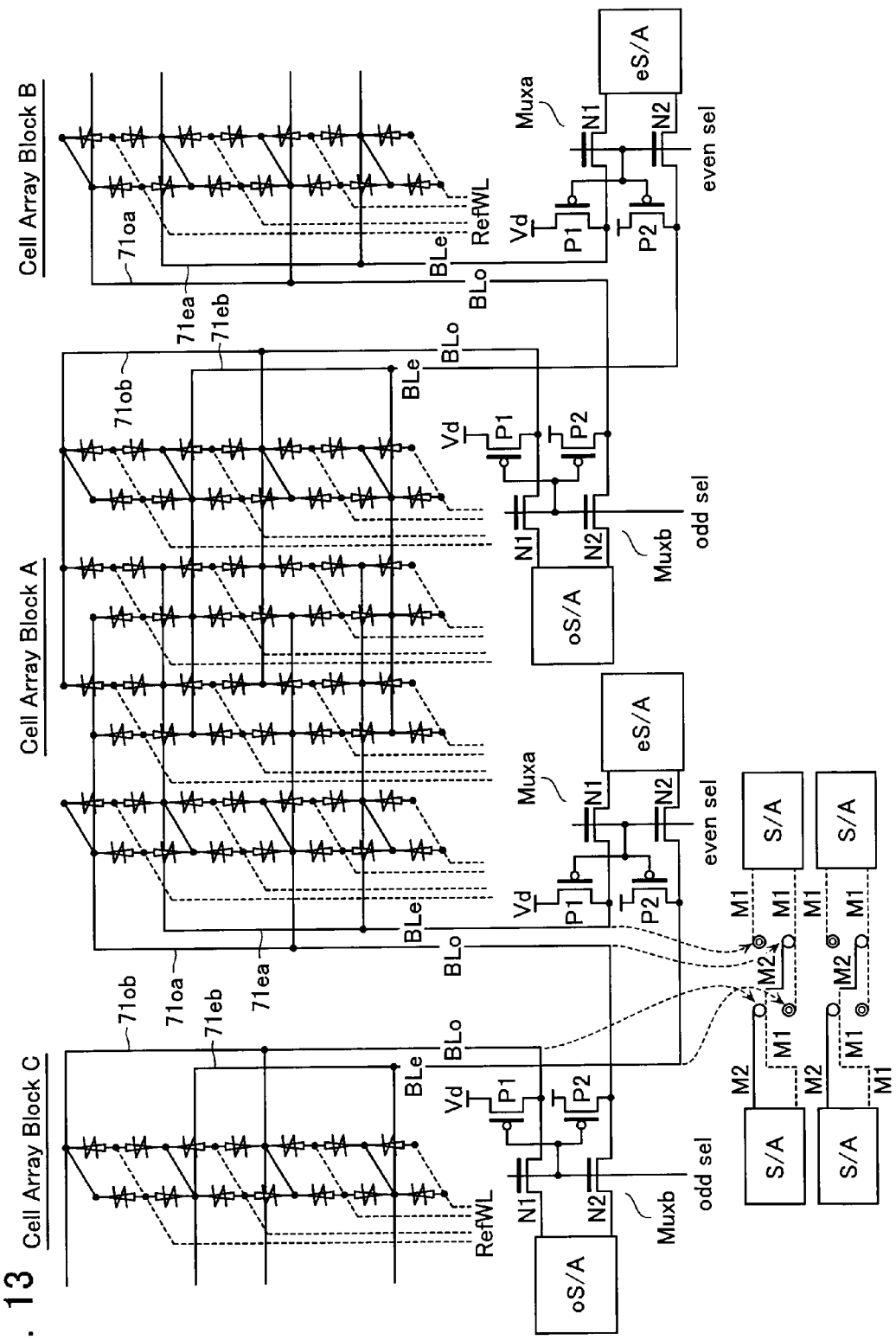
FIG. 13 shows Mux portions, which serve for coupling bit lines to sense amplifiers.

FIG. 13 shows how the bit lines in three cell array blocks A, B and C, which are arranged adjacent to each other in the y-direction, are coupled to sense amplifiers with respect to 4×2×7 cell array block example shown in FIG. 12. That is, it shows a configuration of the multiplexer (MUX) portions formed on the substrate.

Note here that a differential type of and a current detecting type of sense amplifier proposed by us in JP A2005-285161 may be used for the sense amplifiers oS/A and eS/A for sensing a small current at a high rate.

It will be explained a case where the sense amplifier assignment shown in FIG. 4 is used. It should be noted that in case of the sense amplifier assignment shown in FIG. 5, the layout of the multiplexer (Mux) portions disposed on the both ends of the central cell array block are changed to a point symmetric one from the translational symmetric layout.

In a read mode, data of a selected memory cell is read to one of a bit line pair in adjacent cell array blocks; and data of a reference cell to the other of the bit line pair. These data are input to differential input nodes of sense amplifier eS/A via common bit line BLe in the even cell array layers, or sense amplifier oS/A via common bit line BLo in the odd cell array layers.

Disposed between these input nodes of the sense amplifier and the respective common bit lines (via wirings 71) are selecting NMOS transistors N1 and N2, which constitute a selection circuit of multiplexer Muxa or Muxb, and are driven by selection signal "even sel" or "odd sel". Further disposed at the respective common bit lines are pull-up PMOS transistors P1 and P2, which serve for setting the common bit lines at Vd at a non-selected time.

For example, when memory cells in an even cell array layer are selected, select signal "even sel" becomes "H", and pairs of bit lines BLe are coupled to the corresponding sense amplifiers eS/A. At this time, select signal "odd sel" is kept at "L", so that the bit lines BLo are kept at Vd.

Since two bit lines in the adjacent cell array blocks constitute a pair of the open bit line scheme to be coupled to a sense amplifier underlying a cell array block, one of the two bit lines is to be got into under the cell array block. Explaining in detail with respect to the vertical wirings arranged between the cell array blocks A and C in the example shown in FIG. 13, bit line BLo within the common bit lines BLe and BLo drawn from the cell array A is required to be coupled to the sense amplifier oS/A underlying the cell array block C; and bit line BLe drawn from the cell array A to the sense amplifier eS/A underlying the cell array block A.

FIG. 13 shows a layout of two metal wiring layers, which is necessary to achieve the above-described cross coupling. Here is shown such a case that the lowest metal layer is used for not only word lines but also other cross coupling wirings. Odd bit line BLo is contacted with the second metal layer, and it is coupled to an input node of the sense amplifier via the first metal layer wiring.

That is, supposing that the lower metal layer M1 (shown by a dotted line) and the upper metal layer M2 (shown by a solid line) are used at the multiplexer area, bit lines BLe of the cell array blocks A and C are contacted with wirings formed of the lower metal layer M1 via the vertical wirings 71ea and 71eb. By contrast, bit lines BLo of the cell arrays A and C are contacted with wirings formed of the upper metal layer M2 via the vertical wirings 71oa and 71ob. Part of the upper metal wirings are transferred to the lower metal wirings, and coupled to input nodes of the sense amplifier.

By use of the above-described double metal layer wirings, it becomes possible to achieve the cross-coupling on the area where the vertical wirings are arranged at the minimum pitch. Multiplexers Muxa, Muxb are formed of these multiple metal layers together with selection transistors N1 and N2.

It is not always necessary to read all data on the entire bit lines at a time. In such a case, increasing the number of bit lines per a sense amplifier, it becomes possible to use a relaxed layout condition of the sense amplifiers.

Figure 14:
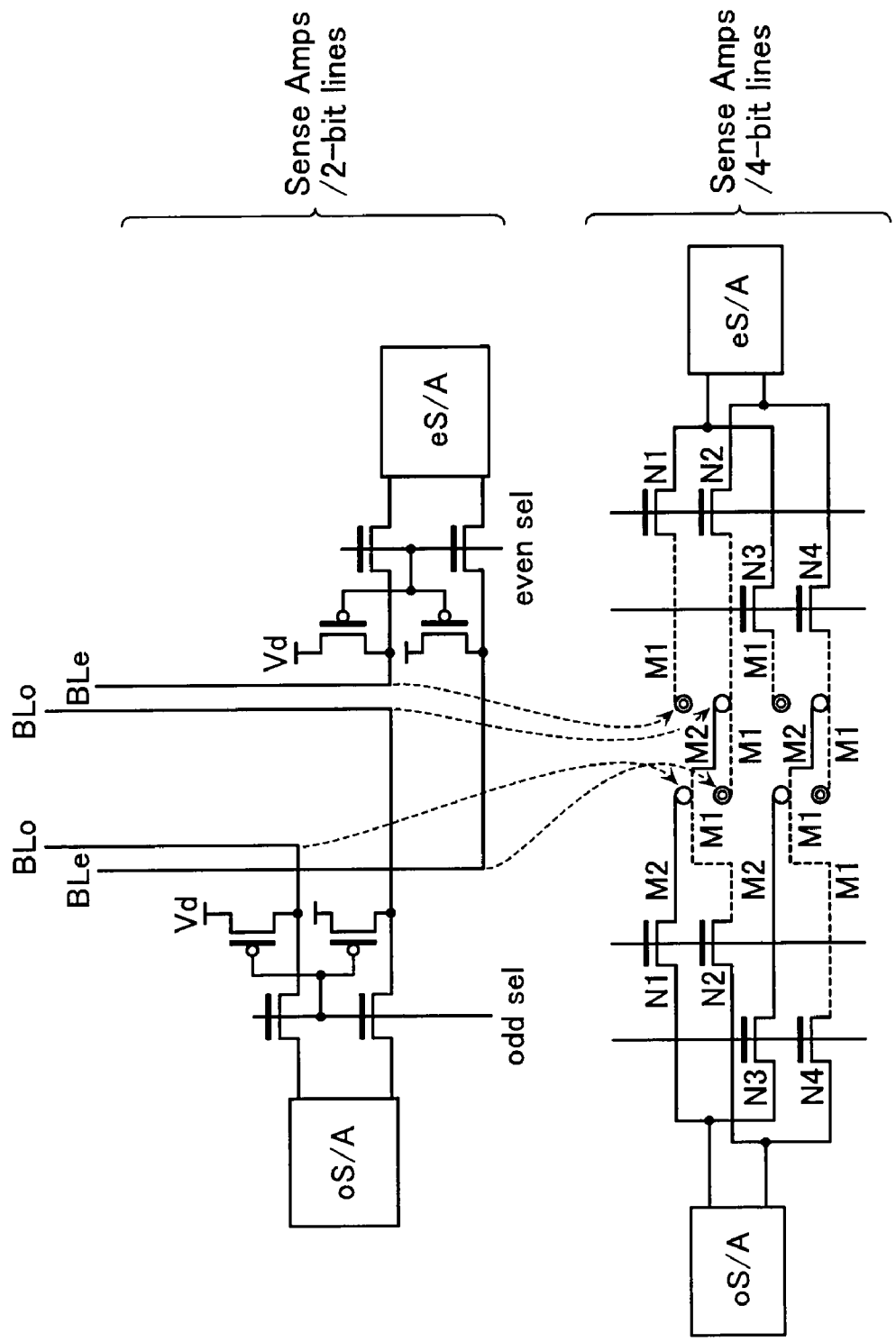
FIG. 14 shows a Mux portion in case of sense amplifier/four bit lines in comparison with that in case of sense amplifier/two bit lines.

FIG. 14 shows a layout example of a sense amplifier per four bit lines in comparison with that of a sense amplifier per two bit lines described above.

Four selecting NMOS transistors N1 to N4 are disposed for a sense amplifier, and selecting signals "even sel1", "even sel2", "odd sel1" and "odd sel2" are prepared, so that two pairs of bit lines are selectively coupled to a sense amplifier.

Although pull-up PMOS transistors are omitted in the layout of example of a sense amplifier per four bit lines shown in FIG. 14, these are necessary like the case of a sense amplifier per two bit lines. Further increasing the selection signals, it becomes possible to combine bit lines more and further reduce the number of sense amplifiers.

This invention is not limited to the above-described embodiment. It will be understood by those skilled in the art that various changes in form and detail may be made without departing from the spirit, scope, and teaching of the invention.

What is claimed is:

1. A resistance change memory device comprising:
a semiconductor substrate;
a cell array so formed on the substrate as to have resistance-change memory cells three-dimensionally stacked and arranged; and
a sense amplifier array formed on the substrate under the cell array, wherein
the cell array includes first and second cell array blocks arranged in a bit line direction, and first and second bit lines are selected from the first and second cell array blocks, respectively, to constitute a pair, and are coupled to differential input nodes in the sense amplifier array, wherein
the first and second cell array blocks include reference cells, each of which has a reference resistance value used for sensing data of a selected memory cell,
the first bit line is connected to a selected memory cell in the first cell array block and connected to one differential input node of the sense amplifier array via a vertical wiring at a side of the second cell array block of the cell array, and
the second bit line is connected to the reference cell in the second cell array block and connected to another differential input node of the sense amplifier array via another vertical wiring at a side of the first cell array block of the cell array.

2. The resistance change memory device according to claim 1, wherein
when a memory cell is selected from one of the first and second cell array blocks at a read time, a reference cell is simultaneously selected from the other cell array block, and data of the selected memory cell and selected reference cell are input to a sense amplifier in the sense amplifier array via the first and second bit lines.

3. The resistance change memory device according to claim 2, wherein
the reference cell is formed of multiple memory cells, which are set in a high resistance state and coupled in parallel so as to obtain the reference resistance value.

4. The resistance change memory device according to claim 2, wherein
the cell array includes first, second and third cell array blocks arranged in the bit line direction, and two systems of sense amplifier arrays and multiplexers are formed on the substrate under the respective cell array blocks, the multiplexers serving for coupling bit lines in the cell array blocks to the sense amplifier arrays, and wherein when a word line is selected in the second cell array block at a read time, two reference word lines are selected simultaneously in the first and third cell array blocks, respectively, and two bit lines selected in the second cell array block, to which data of adjacent two memory cells selected by the word line are read out, and two reference bit lines selected in the first and third cell array blocks, to which data of two reference cells selected by the two reference word lines are read out, constitute two pairs of bit lines, the two pairs of bit lines being coupled to two sense amplifiers selected in first and second sense amplifier arrays under the second cell array block, and third and fourth sense amplifier arrays disposed near the second cell array block under the first and third cell array blocks, respectively, in accordance with the multiplexers.

5. The resistance change memory device according to claim 4, wherein
the two bit lines are drawn to opposite end sides of the second cell array block and coupled to one differential input nodes in the two sense amplifiers via vertical wirings and the multiplexers; and the two reference bit lines are drawn to end sides near the second cell array block in the first and third cell array blocks, respectively, and coupled to the other differential input nodes in the two sense amplifiers via vertical wirings and the multiplexers.

6. The resistance change memory device according to claim 4, wherein
each cell array block is formed of multiple layers in such a manner that adjacent layers are so stacked as to share bit lines and word lines, and wherein
even numbered bit lines and odd numbered bit lines defined in the stacking direction are coupled in common to each other via vertical wirings at end portions of each cell array block, respectively; and shared bit lines of a certain cell array block are cross-coupled to sense amplifier arrays under another cell array block adjacent to the certain cell array block by use of multi-layer metal wirings formed in the multiplexers.

7. The resistance change memory device according to claim 4, wherein
additional cell array blocks with reference cells formed therein and additional sense amplifier arrays formed under the additional cell array blocks are further disposed at both end portions of the cell array block arrangement.

8. A resistance change memory device comprising:
a semiconductor substrate;
first, second and third cell array blocks formed on the substrate and arranged in a bit line direction, each cell array block including resistance-change memory cells three-dimensionally stacked and arranged;
two systems of sense amplifier arrays formed on the substrate under each cell array block; and
vertical wirings disposed on both sides of each cell array block in the bit line direction, to which adjacent bit lines in each layer in the cell array block are alternatively coupled, wherein
each layer of the cell array blocks comprises:
bit lines and word lines disposed to cross each other;
memory cells disposed at cross points of the bit lines and word lines;
reference cells formed of multiple memory cells disposed at both end portions of adjacent two bit lines to be connected in parallel, the reference cells being coupled to the adjacent two bit lines one by one; and reference word lines disposed in parallel with the word lines to drive the reference cells.

9. The resistance change memory device according to claim 8, wherein
first and second memory cells coupled to first and second bit lines, respectively, which are disposed adjacent to each other, are selected by a word line in a certain layer in the second cell array block at a read time, and first and second reference cells coupled to third and fourth bit lines, respectively, are selected simultaneously by the reference word lines in the corresponding layers in the first and third cell array blocks, respectively, the first and third bit lines constituting a pair of bit lines, which are coupled to differential input nodes of a first sense amplifier via the vertical wirings disposed between the first and second cell array blocks while the second and fourth bit lines constitute another pair of bit lines, which are coupled to differential input nodes of a second sense amplifier via the vertical wirings disposed between the second and third cell array blocks.

10. The resistance change memory device according to claim 9, wherein
the first and second sense amplifiers are simultaneously selected from the sense amplifier arrays under the second and third cell array blocks, respectively.

11. The resistance change memory device according to claim 9, wherein
the first and second sense amplifiers are simultaneously selected from the sense amplifier arrays under the second and first cell array blocks, respectively.

12. The resistance change memory device according to claim 8, wherein
the cell array blocks are so stacked as to share the bit lines and the word lines between adjacent two layers.

13. The resistance change memory device according to claim 8, wherein
the memory cell stores at least two data levels defined by a high resistance state and a low resistance state; and the reference cell is formed of multiple memory cells set in the high resistance state to have a reference resistance value set between the high resistance state and the low resistance state.

14. The resistance change memory device according to claim 8, further comprising multiplexers formed on the substrate adjacent to the sense amplifier arrays for selectively coupling the bit lines drawn via the vertical wirings to the sense amplifier arrays.

15. The resistance change memory device according to claim 14, wherein
each cell array block is formed of multiple layers stacked in such a manner that adjacent layers share bit lines or word lines, and
even numbered bit lines and odd numbered bit lines defined in the stacking direction are coupled in common to the vertical wirings, respectively; and shared bit lines of a certain cell array block are cross-coupled to the sense amplifier arrays under another cell array block adjacent to the certain cell array block by use of multi-layer metal wirings formed in the multiplexer circuits.

16. The resistance change memory device according to claim 8, wherein
additional cell array blocks with reference cells formed therein and additional sense amplifier arrays formed under the additional cell array blocks are further disposed at both end portions of the cell array block arrangement.

* * * * *